(12) United States Patent
Shimizu

(10) Patent No.: US 8,093,923 B2
(45) Date of Patent: Jan. 10, 2012

(54) SEMICONDUCTOR DEVICE

(75) Inventor: Kazuhiro Shimizu, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 134 days.

(21) Appl. No.: 12/436,327

(22) Filed: May 6, 2009

(65) Prior Publication Data

US 2010/0148823 A1    Jun. 17, 2010

(30) Foreign Application Priority Data

Dec. 17, 2008    (JP) ................. 2008-321391

(51) Int. Cl.
*H01L 25/00*    (2006.01)

(52) U.S. Cl. . 326/102; 257/501; 257/516; 257/E27.011; 326/83; 326/86; 326/81

(58) Field of Classification Search .............. 326/81–83, 326/86–87, 102–103, 112, 115; 257/140, 257/133, 206, 509, 506, 492, 341, 513, 514, 257/515, 170, 374, 466, 510, E27.014, E27.06, 257/E29.2
See application file for complete search history.

(56) References Cited

U.S. PATENT DOCUMENTS

| | | | | |
|---|---|---|---|---|
| 6,439,514 | B1 * | 8/2002 | Yamaguchi et al. | 257/500 |
| 6,603,176 | B2 * | 8/2003 | Akiyama | 257/351 |
| 7,049,850 | B2 * | 5/2006 | Shimizu | 326/100 |
| 7,582,946 | B2 * | 9/2009 | Shimizu | 257/501 |

FOREIGN PATENT DOCUMENTS

| | | |
|---|---|---|
| JP | 9-55498 | 2/1997 |
| JP | 9-283716 | 10/1997 |
| JP | 11-97550 | 4/1999 |
| JP | 2002-324848 | 11/2002 |
| JP | 2003-533886 | 11/2003 |
| JP | 2005-64472 | 3/2005 |
| JP | 2005-123512 | 5/2005 |
| JP | 2007-5823 | 1/2007 |
| JP | 2007-27358 | 2/2007 |
| KR | 10-0668100 | 1/2007 |
| WO | WO 01/88992 A2 | 11/2001 |

OTHER PUBLICATIONS

Office Action issued Jan. 7, 2011, in Korean Patent Application No. 10-2009-0071185, (with English-language Translation).
Office Action issued Apr. 12, 2011, in Japanese Patent Application No. 2008-321391 with partial English translation.

* cited by examiner

*Primary Examiner* — Shawki S Ismail
*Assistant Examiner* — Christopher Lo
(74) *Attorney, Agent, or Firm* — Oblon, Spivak, McClelland, Maier & Neustadt, L.L.P.

(57) ABSTRACT

An RESURF region is formed so as to surround a high-potential logic region with an isolation region interposed therebetween, in which a sense resistance and a first logic circuit which are applied with a high potential are formed in high-potential logic region. On the outside of RESURF region, a second logic circuit region is formed, which is applied with the driving voltage level required for driving a second logic circuit with respect to the ground potential. In RESURF region, a drain electrode of a field-effect transistor is formed along the inner periphery, and a source electrode is formed along the outer periphery. Furthermore, a polysilicon resistance connected to sense resistance is formed in the shape of a spiral from the inner peripheral side toward the outer peripheral side.

8 Claims, 17 Drawing Sheets

SEMICONDUCTOR DEVICE

BACKGROUND OF THE INVENTION

1. Field of the Invention

The present invention relates to a semiconductor device, and particularly to a semiconductor device provided with a high withstand voltage element used for a drive control circuit which operates an induction motor and the like.

2. Description of the Background Art

In the drive control circuit which operates the load such as an induction motor, a first IGBT (Insulated Gate Bipolar Transistor) and a second IGBT are connected in series as a switching element, and the load is connected at the connection point between the first IGBT and the second IGBT. The first IGBT is connected to the high voltage side and the second IGBT is connected to the ground voltage (potential) side. The first IGBT and the second IGBT are alternately turned on and off, the current is supplied to the load in the state where the first IGBT is turned on, and the current is derived from the load in the state where the second IGBT is turned on.

In order to alternately turn on and off the first IGBT and the second IGBT, a first logic circuit is connected to the gate of the first IGBT, and a second logic circuit is connected to the gate of the second IGBT. In the first logic circuit, the potential at the connection point is used as a reference to output the signal for turning on and off the gate of the first IGBT. In the second logic circuit, the ground potential is used as a reference to output the signal for turning on and off the gate of the second IGBT.

Since the potential at the connection point varies between the high voltage potential and the ground potential, particularly, a predetermined level shift circuit using the characteristics of a field-effect transistor is connected to the first logic circuit. In this level shift circuit, the drain of the field-effect transistor is connected to a sense resistance provided in the first logic circuit. Also connected to this drain is a polysilicon resistance. The drain voltage is detected by detecting the current flowing through the polysilicon resistance.

Based on the detected drain voltage, a predetermined voltage is applied to the gate of the field-effect transistor such that the drain current attains an almost constant value. When the field-effect transistor is turned on, a constant drain current flows through the sense resistance. Accordingly, even in the case where the potential at the connection point varies, a constant potential difference occurs between both ends of the sense resistance connected to the drain, and this potential difference is used as a pulse potential to turn on and off the gate of the first IGBT.

With regard to above-described type of the semiconductor device, the sense resistance, the first logic circuit and the like are formed in the high withstand voltage potential island on the semiconductor substrate. In the high withstand voltage potential island, a first RESURF (REduced SURface Field) isolation region is formed so as to surround the first logic circuit and the like to which a high potential is applied, and thus, a high potential is held in the inner peripheral portion in the first RESURF isolation region with respect to the peripheral region.

Furthermore, the field-effect transistor and the polysilicon resistance are formed in a high withstand voltage LDMOS (Laterally Diffused Metal Oxide Semiconductor) region adjacent to the high withstand voltage potential island. In the high withstand voltage LDMOS region, a second RESURF region is formed so as to surround the drain electrode which is connected to the sense resistance and is applied with a high potential. The polysilicon resistance is formed on the second RESURF region in the shape of a spiral from the high potential (drain) side.

The circuit detecting the current flowing through the polysilicon resistance, the gate drive circuit applying a predetermined voltage to the gate, and the like are formed in a second logic circuit region disposed in the vicinity of the high withstand voltage potential island and the high withstand voltage LDMOS region. The circuit detecting the current flowing through the polysilicon resistance is connected to the low potential side of the polysilicon resistance. The gate drive circuit is connected to the gate of the field-effect transistor. One of the documents disclosing such a semiconductor device is Japanese Patent Laying-Open No. 09-283716.

With regard to the semiconductor device as described above, in the first logic circuit formed in the high withstand voltage potential island, in order to detect as a logic signal the potential difference occurring between both ends of the sense resistance, the potential of the high withstand voltage potential island should be held at least by the potential difference for the logic signal with respect to the potential of the drain electrode. Accordingly, the high withstand voltage potential island and the high withstand voltage LDMOS region are separately formed in the semiconductor substrate.

The first RESURF region which provides electrical isolation between the high withstand voltage potential island which is applied with a voltage of approximately 600 V and the peripheral region (low potential region) requires an isolation distance (width) of approximately 100 μm or more. Furthermore, the high withstand voltage LDMOS region also requires the second RESURF region which provides electrical isolation between the high withstand voltage LDMOS region and the peripheral region.

SUMMARY OF THE INVENTION

The present invention suggests a proposal for improving such a semiconductor device, and an object of the present invention is to provide a semiconductor device that is reduced in size by reducing the area occupied by the region in which a circuit is formed in the semiconductor substrate.

The semiconductor device according to the present invention includes a first logic circuit region, an annular region, an isolation region, and a second logic circuit region. The first logic circuit region is formed on the main surface of a first conductivity type semiconductor substrate, includes a first resistance and a first logic circuit operating with a first driving voltage to control the operation of a predetermined switching element, and is applied with a first voltage as a bias voltage. The annular region is annularly formed on the main surface of the semiconductor substrate to circumferentially surround the first logic circuit region and includes a field-effect transistor and a second resistance which are electrically connected to the first resistance. The isolation region is formed between the first logic circuit region and the annular region, and provides electrical isolation between the first logic circuit region and the annular region. The second logic circuit region is formed on the main surface of the semiconductor substrate located outside the annular region, includes a second logic circuit electrically connected to the field-effect transistor and the second resistance to operate with a second driving voltage, and is applied with a second voltage as a bias voltage lower than the first voltage.

The first logic circuit controls the operation of the switching element based on a predetermined potential difference caused by a drain current flowing through the first resistance when the field-effect transistor is turned on. The second logic circuit detects a current flowing through the second resistance to thereby determine a gate voltage to be applied to a gate of the field-effect transistor in order to cause a constant current to flow as the drain current, and apply the gate voltage to the gate. The annular region electrically isolates a drain of the field-effect transistor applied with the first voltage with respect to the second logic circuit region. The isolation region electrically isolates the first logic circuit region at least by the first driving voltage with respect to the drain of the field-effect transistor which is applied with the first voltage.

According to the semiconductor device in accordance with the present invention, a first logic circuit region is provided which includes a first logic circuit and a first resistance controlling the operation of a predetermined switching element, and is applied with a first voltage as a bias voltage. An annular region including a field-effect transistor and a second resistance which are electrically connected to the first resistance is formed so as to circumferentially surround the first logic circuit region with an isolation region interposed therebetween. On the outside of the annular region, a second logic circuit region is formed which includes a second logic circuit electrically connected to a field-effect transistor and a second resistance and is applied with a second voltage as a bias voltage lower than the first voltage.

This eliminates the need of a region for electrically isolating the first logic circuit region which is applied with the first voltage as a bias voltage with respect to the second logic circuit region which is applied with the second voltage as a bias voltage, in contrast to the case where the first logic circuit region including the first logic circuit and the first resistance and applied with the first voltage as a bias voltage and the region including the field-effect transistor and the second resistance which are electrically connected to the first resistance are separately formed. Consequently, the area occupied by the semiconductor device is reduced, which allows downsizing of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
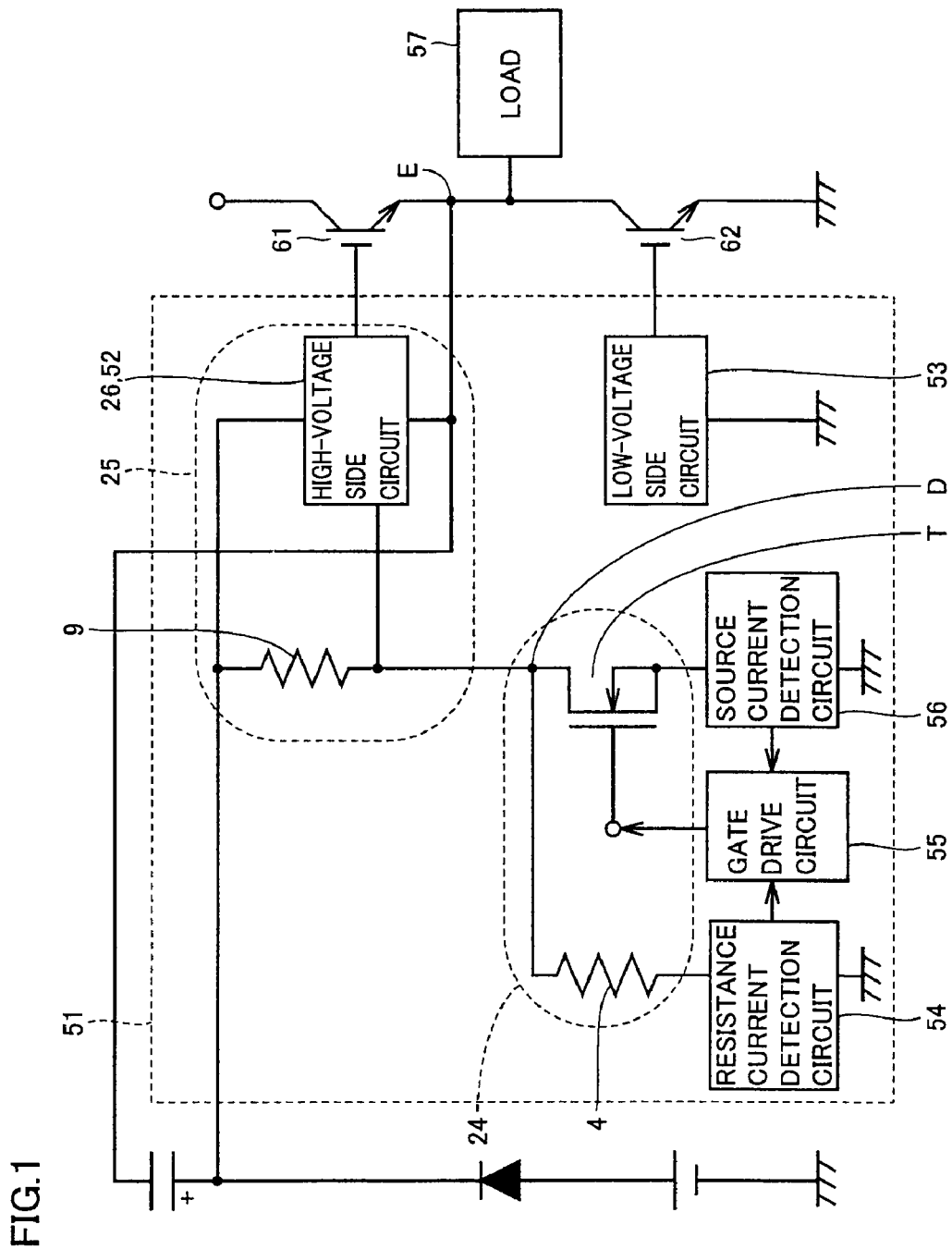
FIG. 1 is a circuit diagram showing an equivalent circuit of a semiconductor device according to each embodiment of the present invention.

An example of a drive control circuit to which the present semiconductor device is applied will be first described. As shown in FIG. 1, as a switching element, a first IGBT 61 and a second IGBT 62 are connected in series, and a load 57 such as an induction motor is connected at a connection point E between first IGBT 61 and second IGBT 62. The collector of first IGBT 61 is connected to the high voltage side and the emitter of second IGBT 62 is connected to the ground voltage (potential) side. First IGBT 61 and second IGBT 62 are alternately turned on and off. The current is supplied to load 57 in the state where first IGBT 61 is turned on, and the current is derived from the load in the state where second IGBT 62 is turned on.

In order to alternately turn on and off first IGBT 61 and second IGBT 62, a first logic circuit 26 (high-voltage side circuit 52) is connected to the gate of first IGBT 61 and a low-voltage side circuit 53 is connected to the gate of second IGBT 62. In high-voltage side circuit 52, the signal for turning on and off the gate of first IGBT 61 is output using the potential at connection point E as a reference. In low-voltage side circuit 53, the signal for turning on and off the gate of second IGBT 62 is output using the ground potential as a reference.

Since the potential at connection point E varies between a high potential (for example, 600V) and the ground potential, particularly, a predetermined level shift circuit using the relationship between the drain voltage and the drain current of the field-effect transistor is connected to high-voltage side circuit 52. In the level shift circuit, a drain D of a field-effect transistor T is connected to a sense resistance 9 which connects to high-voltage side circuit 52. Furthermore, a polysilicon resistance 4 is connected to this drain D.

The drain voltage is detected by detecting the current flowing through polysilicon resistance 4. Based on the detected drain voltage, a predetermined voltage will be applied to the gate of field-effect transistor T such that the drain current attains an approximately constant value.

Figure 2:
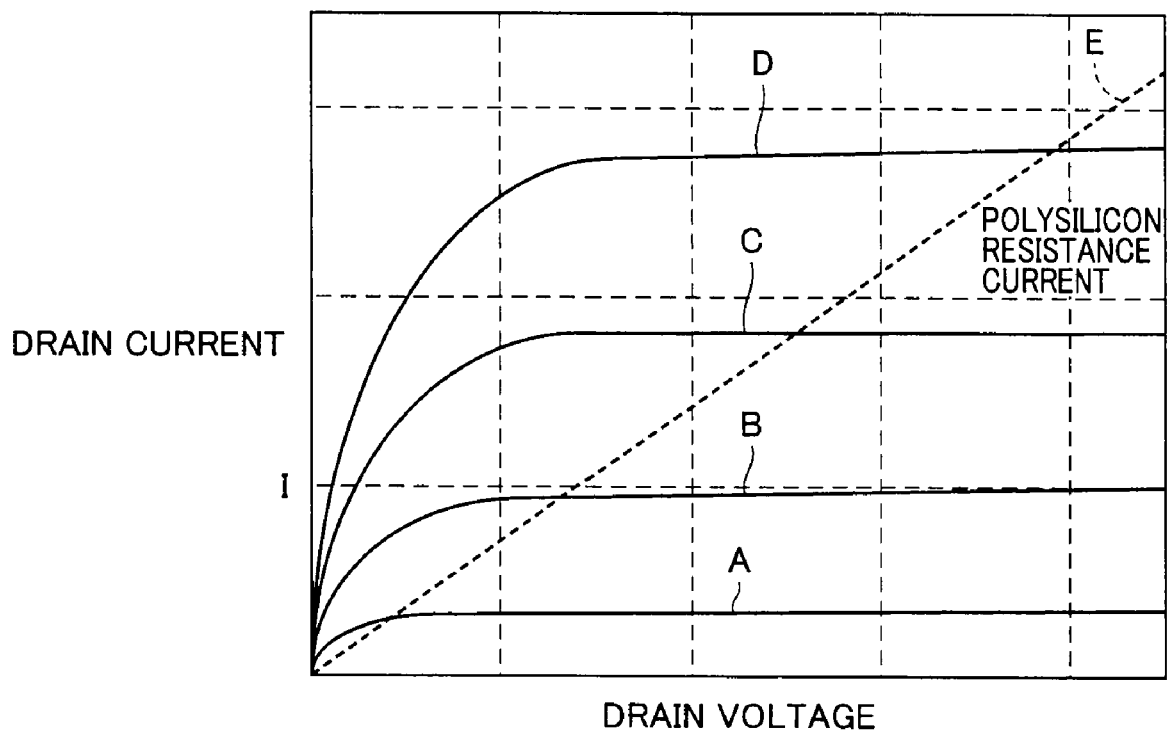
FIG. 2 is a graph showing the gate voltage dependency of a drain voltage and a drain current flowing through a field-effect transistor for illustrating the operation of the semiconductor device in each embodiment.

The foregoing will be more specifically described below. The general relationship between the drain voltage and the drain current of the field-effect transistor and the relationship between the drain voltage and the current flowing through the polysilicon resistance are shown in FIG. 2. As shown in FIG. 2, graphs A-D each show the gate voltage dependency of the relationship between the drain voltage and the drain current of the field-effect transistor. Graphs B-D show the relationships in the case where a gate voltage Vg is, for example, 9V, 12V and 15V, respectively. A graph E shows the relationship between the drain voltage and the current flowing through the polysilicon resistance.

A desired operating current (drain current) is herein indicated by I. In this case, based on graph E, the current flowing through the polysilicon resistance is detected to thereby determine the drain voltage. The voltage to be applied to the gate in order to obtain a desired drain current I with respect to the drain voltage is then determined.

In the case where the drain voltage falls within a relatively high range (saturation region), gate voltage Vg to be applied to the gate is held approximately constant. On the other hand, in the case where the drain voltage falls within a relatively low range (linear region), a higher voltage should be applied to the gate in order to obtain desired drain current I. In this way, a predetermined gate voltage is determined which is to be applied to the gate in order to obtain desired drain current I.

When the obtained predetermined voltage is applied to the gate to cause field-effect transistor T to be turned on, a constant current flows from drain D to the source, causing this current to flow through a sense resistance 9. Accordingly, even when the potential at connection point E varies, a constant potential difference occurs between both ends of sense resistance 9 connected to drain D, and thus, the gate of first IGBT 61 can be turned on and off using this potential difference as a pulse potential.

Figure 3:
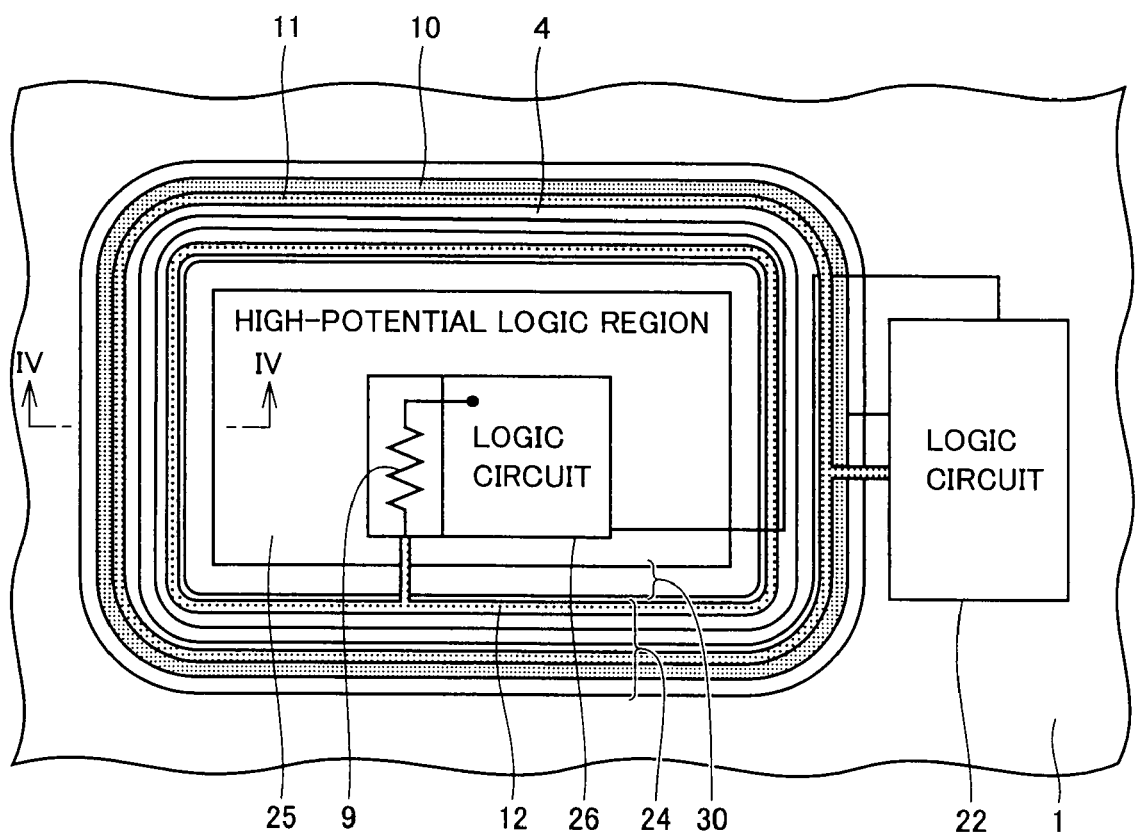
FIG. 3 is a plan view of the semiconductor device according to a first embodiment of the present invention.

The planar structure of the present semiconductor device will then be specifically described. As shown in FIG. 3, on the semiconductor substrate 1, a high-potential logic region 25 is formed in which sense resistance 9, first logic circuit 26 (high-voltage side circuit 52), and the like are formed. An annular RESURF region 24 is formed so as to surround high-potential logic region 25 with an isolation region 30 interposed therebetween. High-potential logic region 25 is electrically isolated by this isolation region 30 at least by a driving voltage required for driving first logic circuit 26 (for example, 15V) with respect to a predetermined high potential (for example, 600V) which is applied to the inner peripheral side (drain) in RESURF region 24.

Furthermore, on the outside of RESURF region 24, a second logic circuit region (peripheral region) is formed, which is applied with the driving voltage level required for driving a second logic circuit 22 with respect to the ground potential. RESURF region 24 provides electrical isolation between the region which is located on the inner peripheral side (drain) in RESURF region 24 and is applied with a high potential and the peripheral region outside RESURF region 24.

In RESURF region 24, a drain electrode 12 of field-effect transistor T is formed in the portion located on the inner peripheral side along the inner periphery, and a source electrode 10 is formed in the portion located on the outer peripheral side along the outer periphery. Furthermore, in RESURF region 24, polysilicon resistance 4 connected to sense resistance 9 is formed in the shape of a spiral from the inner peripheral side toward the outer peripheral side.

In second logic circuit 22, a resistance current detection circuit 54 is formed which is connected to the outer peripheral end (low voltage side) of polysilicon resistance 4 formed in the shape of a spiral and detects the current flowing through polysilicon resistance 4. A source current detection circuit 56 is also formed which is connected to the source of field-effect transistor T to detect the source current. Furthermore, a gate drive circuit 55 is formed, which turns off the gate when the drain voltage determined based on the current detected by resistance current detection circuit 54 is higher than a predetermined drain voltage, or when the source current detected by the source current detection circuit is higher than a predetermined source current.

Figure 4:
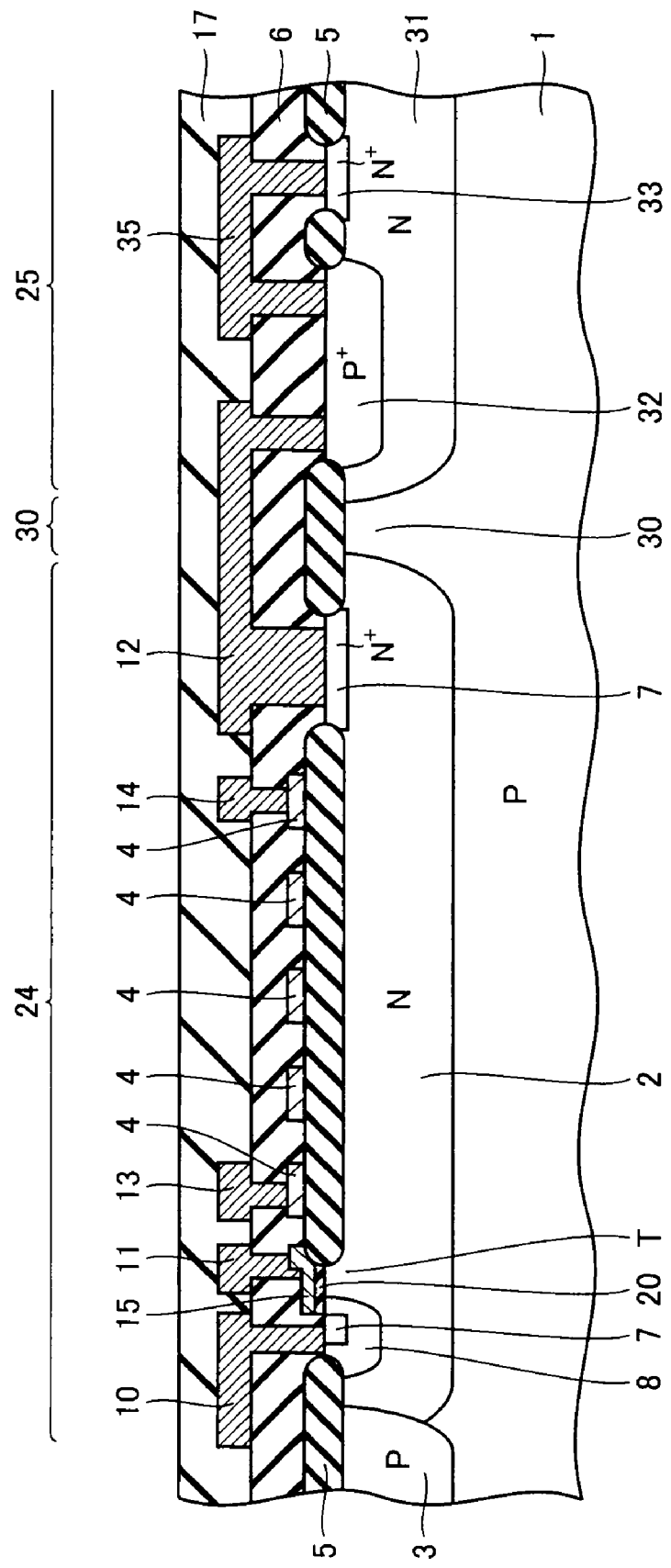
FIG. 4 is a cross sectional view taken along a cross sectional line IV-IV shown in FIG. 3 in the present embodiment.

The cross section structure of the semiconductor device will then be described. As shown in FIG. 4, in RESURF region 24 in a P-type semiconductor substrate 1, an N-type diffusion region 2 is formed from the surface to a predetermined depth. In high-potential logic region 25, an N-type diffusion region 31 is formed from the surface to a predetermined depth. A portion of the P-type region in semiconductor substrate 1 is located between N-type diffusion region 2 and N-type diffusion region 31, and this portion of the P-type region serves as isolation region 30.

In N-type diffusion region 31 to which a high potential is applied, an N+ diffusion region 33 and a P+ diffusion region 32 are formed from the surface to a predetermined depth. P+ diffusion region 32 serves as a diffusion resistance (sense resistance 9). A high-potential island electrode 35 has one end connected to P+ diffusion region 32 and the other end connected to N+ diffusion region 33.

On the side closer to N-type diffusion region 31 in N-type diffusion region 2 (in the inner peripheral portion), drain electrode 12 electrically connected to P+ diffusion region 32 is electrically connected to N-type diffusion region 2 with an N+ diffusion region 7 interposed therebetween. On the side opposite to that closer to N-type diffusion region 31 in N-type diffusion region 2 (in the outer peripheral portion), a gate electrode 11 and source electrode 10 of the field-effect transistor are formed.

Formed between gate electrode 11 and drain electrode 12 is a field oxide film 5, on which polysilicon resistance 4 is formed. A high potential side electrode 14 is connected to the end of polysilicon resistance 4 closer to drain electrode 12, and a low potential side electrode 13 is formed in the end thereof closer to gate electrode 11.

Source electrode 10 is electrically connected to a P-type diffusion region 8 and N+ diffusion region 7 which are formed from the surface of N-type diffusion region 2 to predetermined depths, respectively. Gate electrode 11 is electrically connected to a gate polysilicon film 15 which is formed on the surface of each of P-type diffusion region 8 and N-type diffusion region 2 with a gate oxide film 20 interposed therebetween. Furthermore, a P-type semiconductor layer 3 is formed laterally to N-type diffusion region 2.

Figure 5:
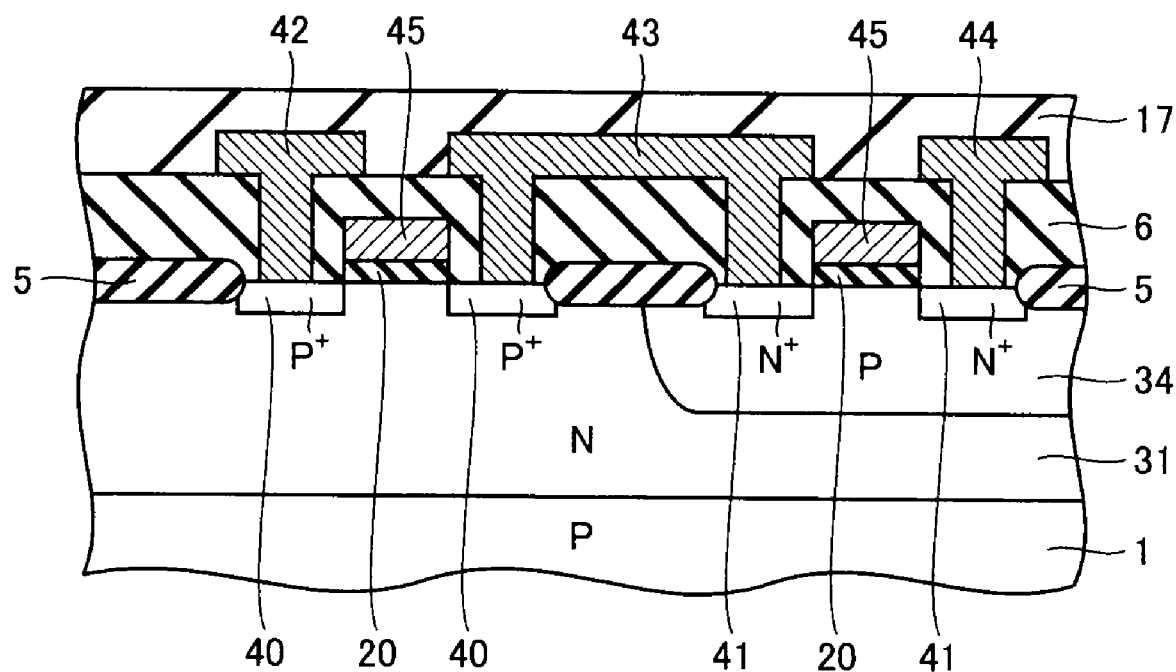
FIG. 5 is a partial cross sectional view of the region in which a complementary MOS transistor is formed in the present embodiment.

In N-type diffusion region 31 forming high-potential logic region 25, a complementary field-effect transistor is also formed, in addition to P+ diffusion region 32 serving as a diffusion resistance. As shown in FIG. 5, on the surface of N-type diffusion region 31, a pair of P+ type diffusion regions 40 serving as a source/drain are formed spaced apart from each other. On the surface of N-type diffusion region 31 interposed between the pair of P+ type diffusion regions 40, a gate polysilicon film 45 is formed with gate oxide film 20 interposed therebetween.

Furthermore, a P-type diffusion region 34 is formed from the surface of N-type diffusion region 31 to a predetermined depth. On the surface of P-type diffusion region 34, a pair of N+ type diffusion regions 41 serving as a source/drain are formed spaced apart from each other. On the surface of P-type diffusion region 34 interposed between the pair of N+ type diffusion regions 41, gate polysilicon film 45 is formed with gate oxide film 20 interposed therebetween.

A p-channel MOS source electrode 42 is connected to one of the pair of P+ type diffusion regions 40. An n-channel/p-channel MOS drain electrode 43 is connected to the other of the pair of P+ type diffusion regions 40 and to one of the pair of N+ type diffusion regions 41. An n-channel MOS source electrode 44 is connected to the other of the pair of N+ type diffusion regions 41.

In the semiconductor device described above, when a high voltage is applied to high-potential island electrode 35, N-type diffusion region 2 located in RESURF region 24 is biased to a predetermined high potential (for example, 600V) with respect to P-type semiconductor substrate 1. N-type diffusion region 31 located in high-potential logic region 25 is biased, with respect to P-type semiconductor substrate 1, to a potential (for example, 615V) which is obtained by further adding a driving voltage (for example, 15V) for driving the logic circuit to the above-mentioned high potential.

Figure 6:
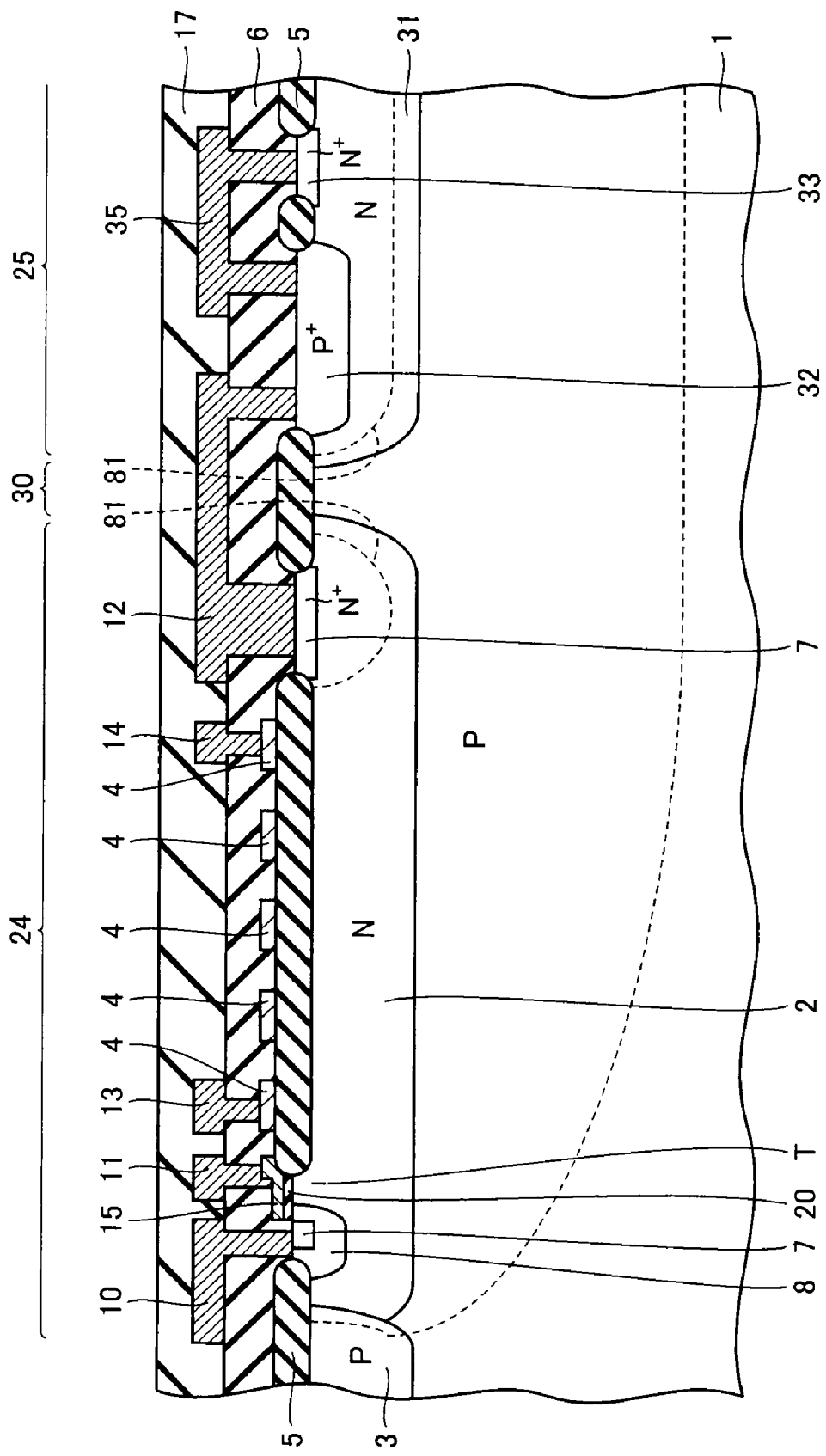
FIG. 6 is a cross sectional view showing how a depletion layer expands in the present embodiment.

In this case, as shown in FIG. 6, the pinch-off effect facilitates formation of a depletion layer in isolation region 30, which results in a relatively smooth depletion layer edge 81 directly below isolation region 30. This prevents the electric field concentration from occurring in the corner portion where N-type diffusion region 2 and N-type diffusion region 31 are opposed to each other, and accordingly, the withstand voltage does not decrease.

Assuming that the vacuum permittivity is $\epsilon_0$, the relative permittivity of silicon is $\epsilon_{Si}$, the voltage for driving the logic is $V_L$, the electric charge quantity of electrons is q, and the impurity concentration of the P-type semiconductor substrate is $N_P$, a width D of isolation region 30 is given by the following expression.

$$D=((2 \cdot \epsilon_0 \cdot \epsilon_{Si} \cdot V_L)/(q \cdot N_P))^{0.5}$$

As described above, in the present semiconductor device, so as to surround high-potential logic region 25 in which sense resistance 9, first logic circuit 26 (high-voltage side circuit 52) and the like are formed, annular RESURF region 24 is disposed with isolation region 30 interposed therebetween. In the RESURF region, a spiral-shaped polysilicon resistance and a field-effect transistor are formed.

Consequently, the area occupied by the circuit region is reduced to allow downsizing of the semiconductor device. This will be described below with reference to a comparative example.

Figure 7:
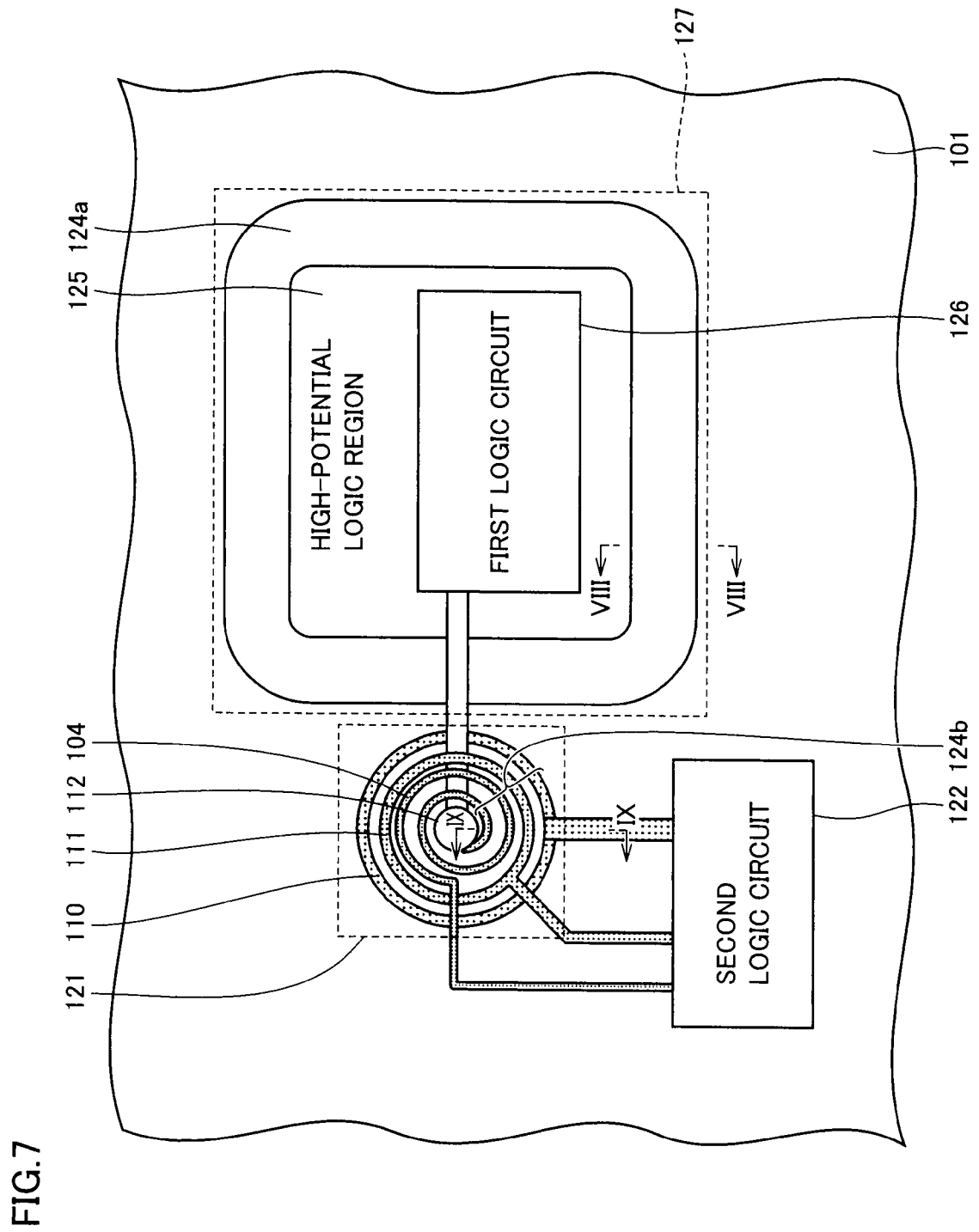
FIG. 7 is a plan view of the semiconductor device according to a comparative example.
Figure 8:
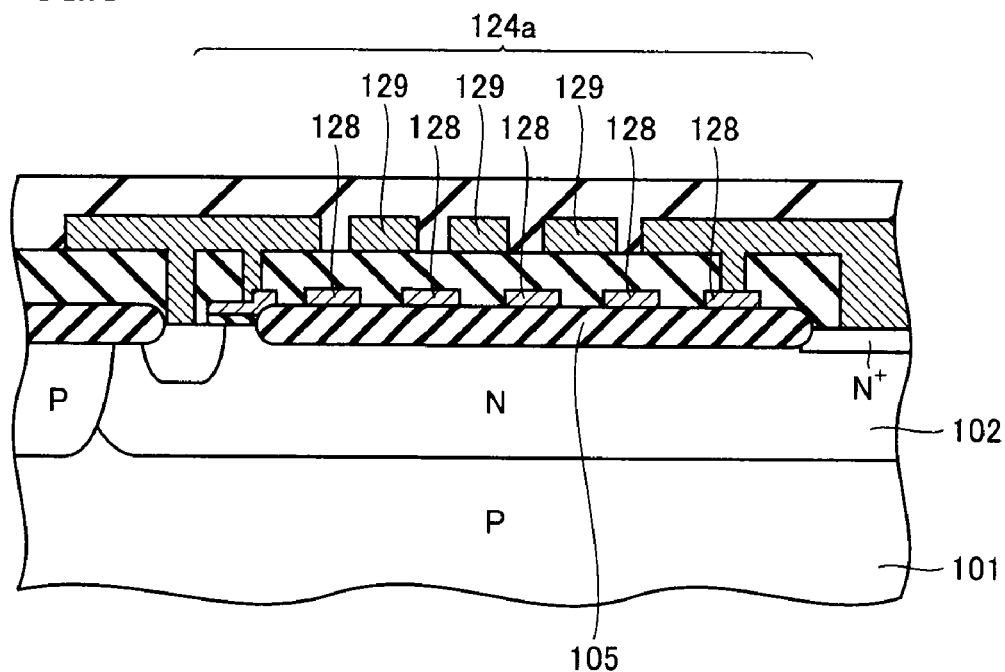
FIG. 8 is a cross sectional view taken along a cross sectional line VIII-VIII shown in FIG. 7.

As shown in FIGS. 7 and 8, in the semiconductor device according to the comparative example, a sense resistance, a first logic circuit 126 and the like are formed in a high withstand voltage potential island 127 in a semiconductor substrate 101. In high withstand voltage potential island 127, a first RESURF isolation region 124a is formed so as to surround a high-potential logic region 125 in which first logic circuit 126 and the like which are applied with a high potential are formed. The high potential in first RESURF isolation region 124a is held with respect to the peripheral region by first RESURF region 124a, a gate polysilicon field plate 128 and an aluminum field plate 129 which are formed on a field oxide film 105 in first RESURF region 124a.

Figure 9:
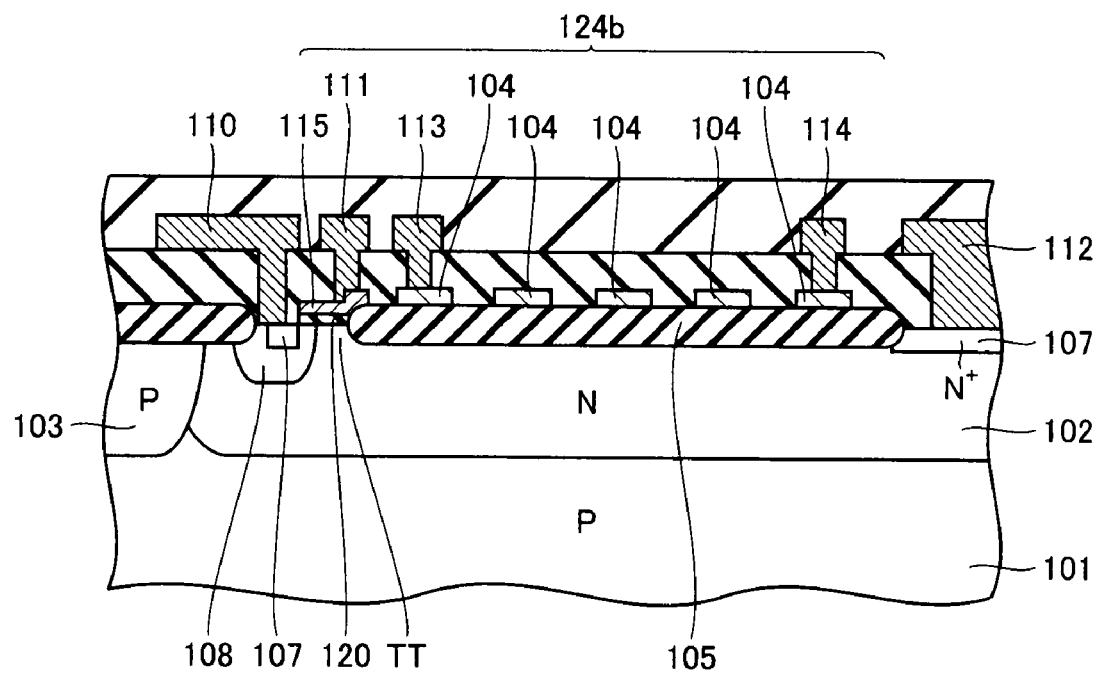
FIG. 9 is a cross sectional view taken along a cross sectional line IX-IX shown in FIG. 7.

Furthermore, as shown in FIGS. 7 and 9, a field-effect transistor TT and a polysilicon resistance 104 are formed in a high withstand voltage LDMOS region 121 which is adjacent to high withstand voltage potential island 127. In high withstand voltage LDMOS region 121, a second RESURF region 124b including an N-type diffusion region 102 is formed so as to surround a drain electrode 112 which is connected to the sense resistance and is applied with a high potential.

In the portion inside of N-type diffusion region 102, drain electrode 112 electrically connected to first logic circuit 126 is electrically connected to N-type diffusion region 102 with N+ diffusion region 107 interposed therebetween. In the portion outside of N-type diffusion region 102, a gate electrode 111 and a source electrode 110 of the field-effect transistor are formed.

Field oxide film 105 is formed between gate electrode 111 and drain electrode 112, and polysilicon resistance 104 is formed on this field oxide film 105. A high potential side electrode 114 is connected to the end of polysilicon resistance 104 which is closer to drain electrode 112, and a low potential side electrode 113 is formed in the end thereof which is closer to gate electrode 111.

Source electrode 110 is electrically connected to a P-type diffusion region 108 and N+ diffusion region 107 which are formed from the surface of N-type diffusion region 102 to predetermined depths, respectively. Gate electrode 111 is electrically connected to a gate polysilicon film 115 which is formed on the surface of each of P-type diffusion region 108 and N-type diffusion region 102 with a gate oxide film 120 interposed therebetween. Furthermore, a P-type semiconductor layer 103 is formed laterally to N-type diffusion region 102. The potential of drain electrode 112 which is applied with a high potential is held by second RESURF region 124b with respect to the peripheral region.

The circuit which detects the current flowing through polysilicon resistance 104, the gate drive circuit which applies a predetermined voltage to the gate, and the like are formed in a second logic circuit 122 disposed in the vicinity of high withstand voltage potential island 127 and high withstand voltage LDMOS region 121. The circuit which detects the current flowing through polysilicon resistance 104 is connected to the low potential side in polysilicon resistance 104. The gate drive circuit is connected to the gate of the field-effect transistor.

Thus, in the semiconductor device according to the comparative example, high withstand voltage potential island 127 and high withstand voltage LDMOS region 121 are separately formed in the semiconductor substrate. This is due to the following reasons.

In the case where high withstand voltage potential island 127 and high withstand voltage LDMOS region 121 are not separately formed, and N-type diffusion region 102 of high withstand voltage potential island 127 and N-type diffusion region 102 of high withstand voltage LDMOS region 121 are connected to each other, a driving voltage may be applied to N-type diffusion region 102 through the source of the p-channel field-effect transistor among the complementary field-effect transistors formed in high withstand voltage potential island 127.

In this case, even when the field-effect transistor of high withstand voltage LDMOS region 121 is turned on, the drain current does not flow through the sense resistance but flows through N-type diffusion region 102 directly into high-potential island electrode. This prevents the potential difference from occurring between both ends of the sense resistance, and accordingly, a predetermined pulse potential for turning on and off the gate of the IGBT cannot be produced. For this reason, high withstand voltage potential island 127 and high withstand voltage LDMOS region 121 are formed separately from each other.

In order to form high withstand voltage potential island 127 and high withstand voltage LDMOS region 121 separately from each other, high withstand voltage potential island 127 requires first RESURF region 124a, and high withstand voltage LDMOS region 121 requires second RESURF region 124b.

In contrast, in the present semiconductor device, so as to surround high-potential logic region 25 in which sense resistance 9, first logic circuit 26 (high-voltage side circuit 52) and the like are formed, annular RESURF region 24 is disposed with isolation region 30 interposed therebetween. The spiral-shaped polysilicon resistance and the field-effect transistor are formed in RESURF region 24.

In other words, in the present semiconductor device, the region where drain electrode 12 is located which is applied with a high potential (for example, 600V) is electrically isolated by RESURF region 24 with respect to the region in semiconductor substrate 1 which is applied with a low potential (for example, 0-15V) of a ground potential level. Furthermore, high-potential logic region 25 which is higher in potential (for example, 615V) is formed, which is electrically isolated by isolation region 30 by a driving voltage for driving the logic with respect to the region where drain electrode 12 is located which is applied with a high potential.

This eliminates the need of first RESURF region 124a which is required for high withstand voltage potential island 127 in the comparative example, with the result that the area occupied by the region in which the circuit is formed can be reduced. Consequently, the semiconductor device can be reduced in size.

Furthermore, in the semiconductor device as described above, RESURF region 24 having the polysilicon resistance and the gate electrode formed therein is greater in circumference than second RESURF region 124b of the semiconductor device according to the comparative example. This causes an increase in length (circumferential length) of the gate of field-effect transistor T, to thereby allow the driving performance of field-effect transistor T to be improved.

Furthermore, the length by which the polysilicon resistance formed in the shape of a spiral is routed is increased, which leads to the resistance value in mega-order (~$10^6$), and thus, the leakage current can be suppressed. Furthermore, as the range of the distance by which the polysilicon resistance can be routed is increased, the degree of design freedom can also be raised.

Second Embodiment

Figure 10:
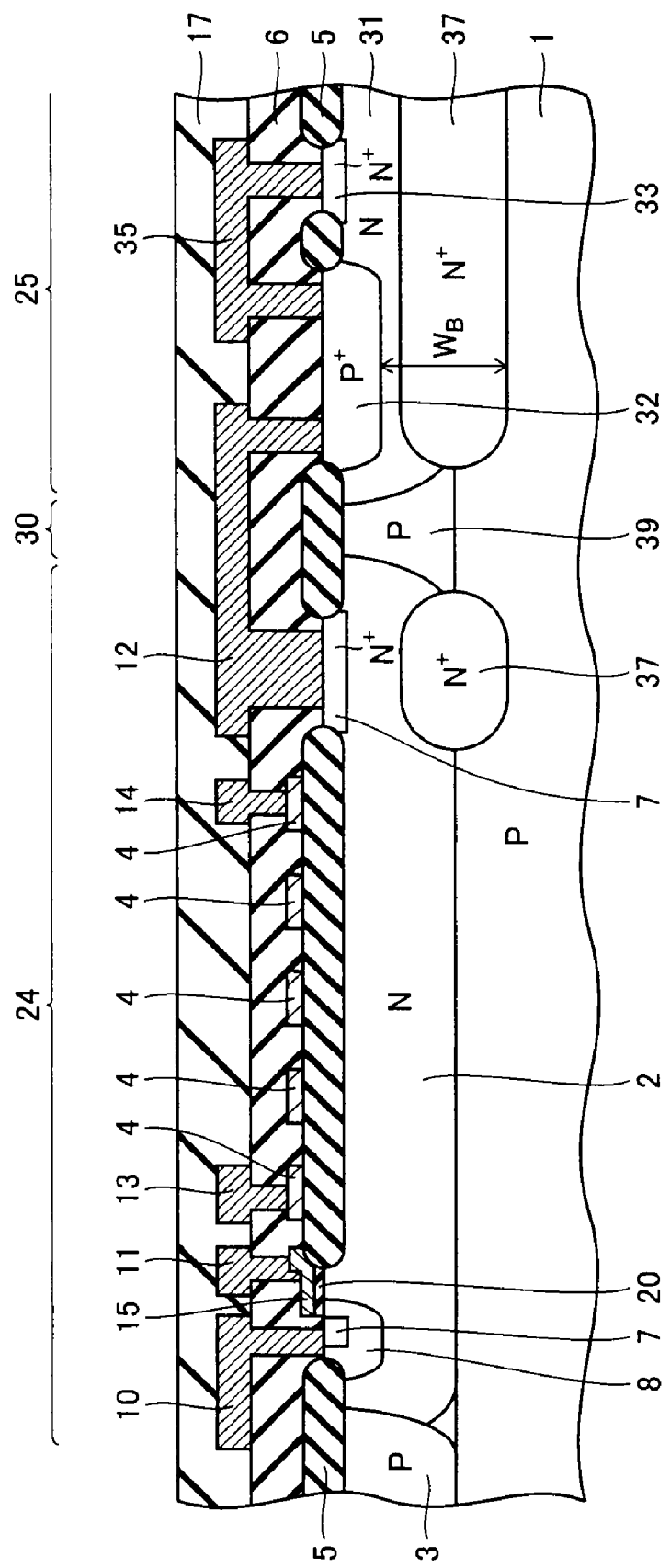
FIG. 10 is a cross sectional view of a semiconductor device according to a second embodiment of the present invention.

The semiconductor device including a buried diffusion region will be hereinafter described. As shown in FIG. 10, a P-type epitaxial growth layer 39 is formed on the surface of P-type semiconductor substrate 1. In high-potential logic region 25, an N+ buried diffusion region 37 is formed between the portion of the P-type region in P-type semiconductor substrate 1 and N-type diffusion region 31. Furthermore, in a RESURF region 24, N+ buried diffusion region 37 is formed in the portion located directly below drain electrode 12 in the area between the portion of the P-type region in P-type semiconductor substrate 1 and N-type diffusion region 2. It is to be noted that since configurations other than this are the same as those shown in FIG. 4, the same components are designated by the same reference characters, and description thereof will not be repeated.

In this semiconductor device, in addition to the fact that the area occupied by the circuit described above can be reduced, the following effects can be achieved. That is, the operation of the parasitic PNP transistor can be suppressed which is formed by P-type semiconductor substrate 1, N-type diffusion region 31, and P+ diffusion region 32 formed from the surface of N-type diffusion region 31 to a predetermined depth.

A current amplification factor hFE is generally used as an indicator of the operation of the bipolar transistor. Assuming that the impurity concentration of the base layer is $N_B$, the width of the base layer is $W_B$ and the impurity concentration of the emitter layer is $N_E$, the current amplification factor represents the following proportional relationship.

$$hFE \propto N_E/(N_B \cdot W_B)$$

In the semiconductor device as described above, N+ buried diffusion region 37 is formed between the portion of the P-type region in P-type semiconductor substrate I and N-type diffusion region 31. The impurity concentration of N+ buried diffusion region 37 is assumed to be approximately $10^{19}$ cm$^{-3}$. This causes the value of impurity concentration $N_B$ of the base layer and the value of width $W_B$ of the base layer to be greater than the value in the case where N+ buried diffusion region 37 is not formed. As a result, the operation of the parasitic PNP transistor can be suppressed to prevent destruction of the semiconductor device due to malfunction of the circuit and latch-up.

It is to be noted that N+ buried diffusion region 37 is formed, for example, by introducing the n-type impurities serving as an N+ buried diffusion region onto the surface of P-type semiconductor substrate 1 to form a P-type epitaxial growth layer on that surface, and then thermally diffusing the introduced n-type impurities.

Third Embodiment

Figure 11:
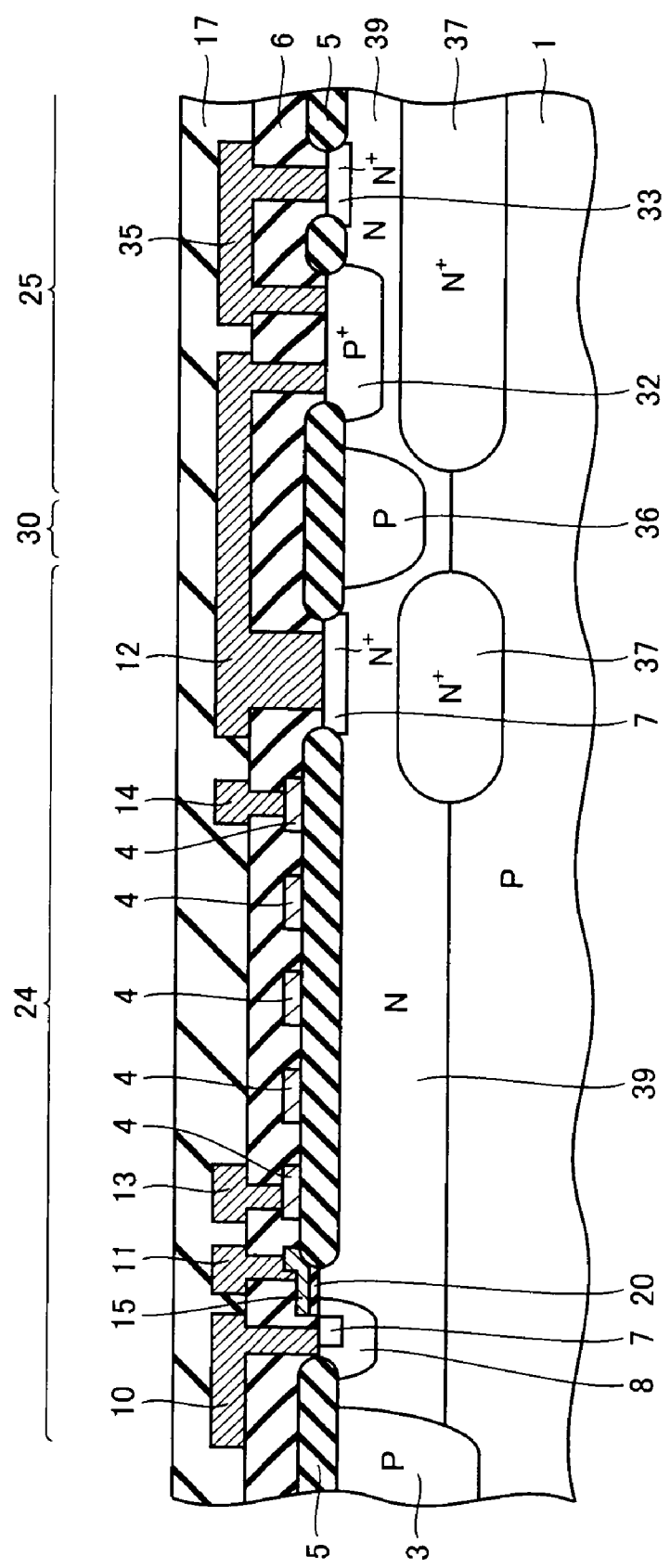
FIG. 11 is a cross sectional view of a semiconductor device according to a third embodiment of the present invention.

The semiconductor device to which the P-type diffusion region is applied as an isolation region will be hereinafter described. As shown in FIG. 11, P-type epitaxial growth layer 39 is formed on the surface of P-type semiconductor substrate 1. An electrically floating P diffusion region 36 is formed to a predetermined depth from the surface of the portion of P-type epitaxial growth layer 39 located between RESURF region 24 and high-potential logic region 25. It is to be noted that since configurations other than this are the same as those shown in FIG. 10, the same components are designated by the same reference characters, and description thereof will not be repeated.

In this semiconductor device, in addition to the fact that the area occupied by the circuit previously described can be reduced, the following effects can be achieved. P diffusion region 36 with a floating potential is formed between RESURF region 24 and high-potential logic region 25, which leads to formation of a parasitic high resistance J-FET (Junction-Field Effect Transistor) region in this region. Consequently, the current can be prevented from flowing between the portion of P-type epitaxial growth layer 39 located in RESURF isolation region 24 and the portion of P-type epitaxial growth layer 39 located in high-potential logic region 25.

Figure 12:
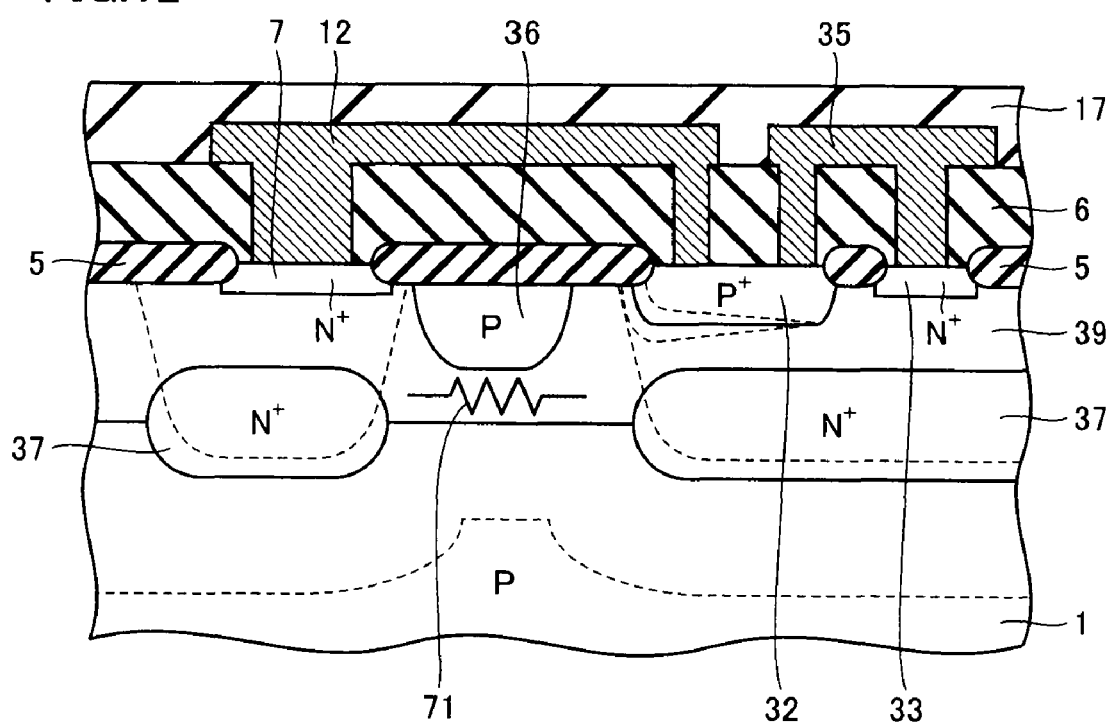
FIG. 12 is a partial cross sectional view for illustrating the operation of the semiconductor device in the present embodiment.

The foregoing will be described below. As shown in FIG. 12, when a high voltage is applied to high-potential island electrode 35, a depletion layer expands from the interface between P-type semiconductor substrate 1 and N-type semiconductor layer 39 and from the interface between P-type semiconductor substrate 1 and N+ buried diffusion region 37. When the depletion layer extending from the above-mentioned interfaces reaches P diffusion region 36 with a floating potential, P diffusion region 36 is biased by the punch-through effect to a potential at the time when the depletion layer reaches the region.

Figure 13:
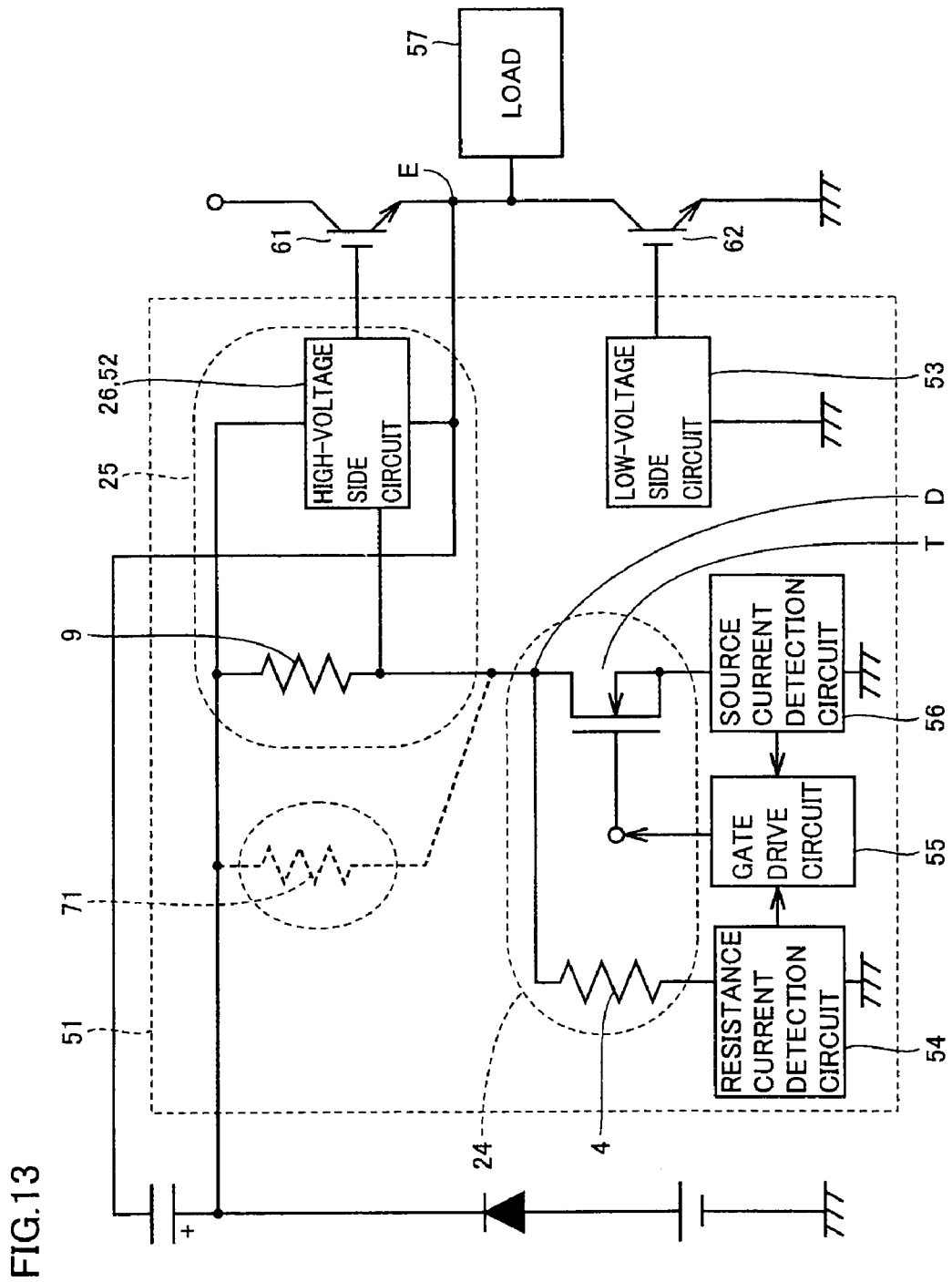
FIG. 13 is a circuit diagram showing the location of a parasitic resistance for illustrating the operation of the semiconductor device in the present embodiment.

Accordingly, a parasitic J-FET structure is formed in the portion (region A) of N-type epitaxial growth layer 39 located directly below P diffusion region 36, to cause a resistance 71 in this region A to be highly resistive. As shown in FIG. 13, this resistance 71 is connected in parallel to sense resistance 9. This causes much of the drain current in the field-effect transistor to flow from drain electrode 12 through P+ diffusion region 32 into high-potential island electrode 35 without flowing through region A. Consequently, a constant potential difference occurs in P+ diffusion region 32 as a sense resistance, and thus, this potential difference is used as a pulse potential to allow the gate of first IGBT 61 (see FIG. 1) to be turned on and off.

Fourth Embodiment

Figure 14:
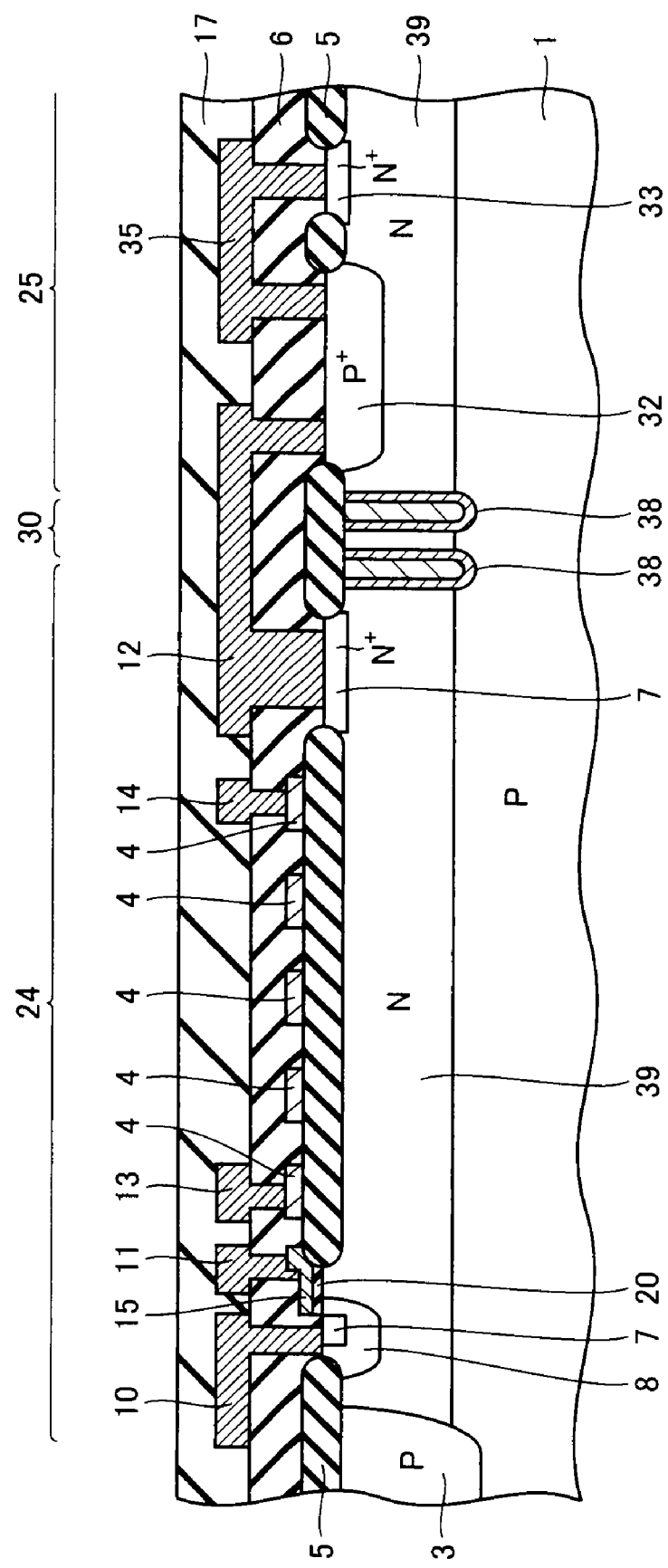
FIG. 14 is a cross sectional view of a semiconductor device according to a fourth embodiment of the present invention.

An example of the semiconductor device to which the trench isolation structure is applied as an isolation region will be hereinafter described. As shown in FIG. 14, P-type epitaxial growth layer 39 is formed on the surface of P-type semiconductor substrate 1. A trench isolation portion 38 extending from the surface of P-type epitaxial growth layer 39 to the region in P-type semiconductor substrate 1 is formed in the portion of P-type epitaxial growth layer 39 located between RESURF region 24 and high-potential logic region 25. It is to be noted that since configurations other than this are the same as those shown in FIG. 11, the same components are designated by the same reference characters, and description thereof will not be repeated.

In this semiconductor device, in addition to the fact that the area occupied by the circuit described above can be reduced, the following effects can be achieved. In the present semiconductor device, trench isolation portion 38 extending from the surface of P-type epitaxial growth layer 39 to the region in P-type semiconductor substrate 1 is formed in the portion of P-type epitaxial growth layer 39 located between RESURF region 24 and high-potential logic region 25.

Consequently, almost complete electrical isolation is provided between the portion of P-type epitaxial growth layer 39 located in RESURF region 24 and the portion of P-type epitaxial growth layer 39 located in high-potential logic region 25. As a result, the drain current flows from drain electrode 12 through P+ diffusion region 32 into high-potential island electrode 35, which allows a constant potential difference as a pulse potential to occur in P+ diffusion region 32 as a sense resistance.

Furthermore, trench isolation portion 38 is provided to thereby allow the region (area) required for electrical isolation to be minimized, which also allows a further contribution to downsizing of the semiconductor device.

Although the example in which two trench isolation portions are used has been described with respect to the above-described semiconductor device, the number of the trench isolation portion is not limited thereto.

Fifth Embodiment

Figure 15:
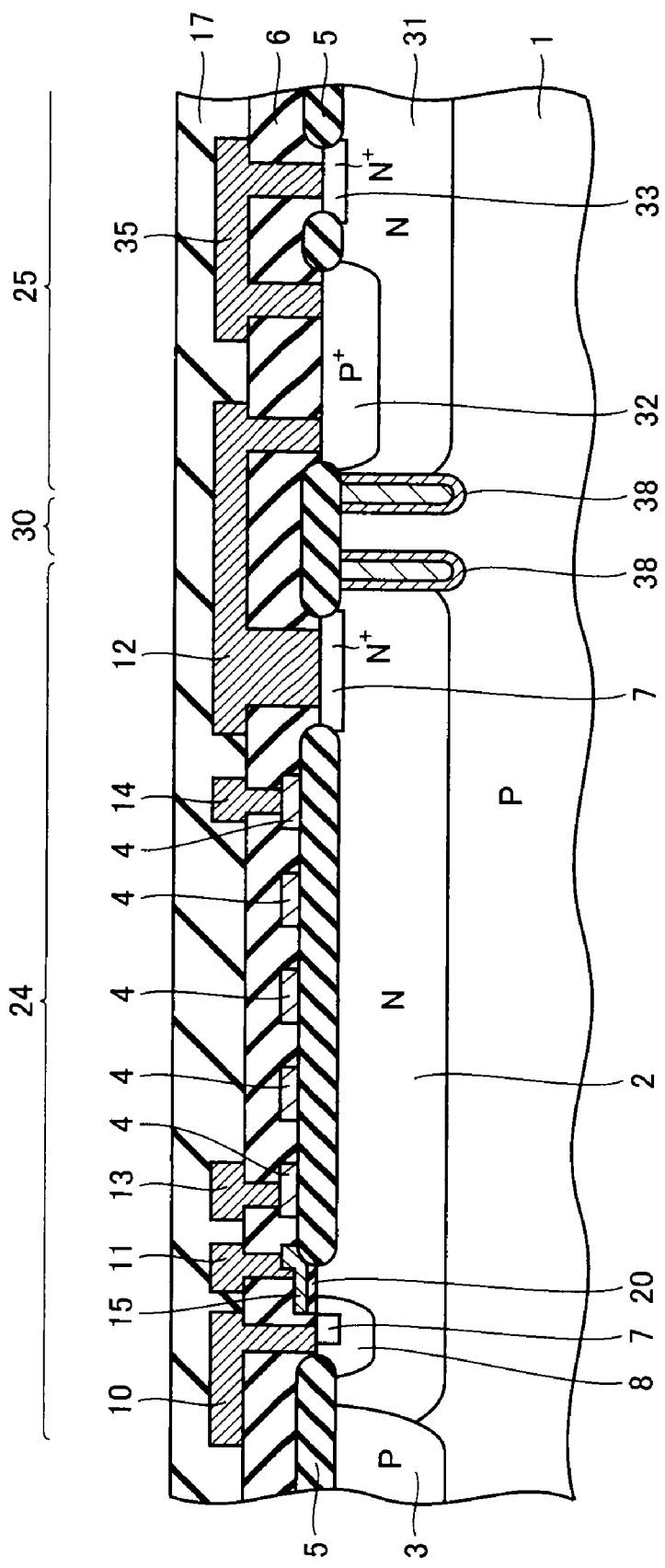
FIG. 15 is a cross sectional view of a semiconductor device according to a fifth embodiment of the present invention.

Another example of the semiconductor device to which the trench isolation structure is applied as an isolation region will be hereinafter described. As shown in FIG. 15, trench isolation portion 38 is formed in an end of N-type diffusion region 2 located in RESURF region 24 which is closer to high-potential logic region 25. Trench isolation portion 38 is also formed in an end of N-type diffusion region 31 located in high-potential logic region 25 which is closer to RESURF region 24. It is to be noted that since configurations other than this are the same as those shown in FIG. 4, the same components are designated by the same reference characters, and description thereof will not be repeated.

In this semiconductor device, in addition to the fact that the area occupied by the circuit previously described can be reduced, the following effects can be achieved. In the present semiconductor device, trench isolation portion 38 is formed before N-type diffusion region 2 and N-type diffusion region 31 are formed. Accordingly, after N-type diffusion region 2 and N-type diffusion region 31 are formed, trench isolation portion 38 can prevent the n-type impurities in N-type diffusion region 2 from diffusing toward N-type diffusion region 31 and can also prevent the n-type impurities in N-type diffusion region 31 from diffusing toward N-type diffusion region 2. Consequently, the region (area) required for electrical isolation can be minimized, which allows a further contribution to downsizing of the semiconductor device.

Sixth Embodiment

An example of the semiconductor device provided with an electrically floating field plate in the RESURF region will then be described. In the semiconductor device to which a high potential of approximately 600 V is applied, the RESURF region requires a distance (width) of about 100 μm or more. Furthermore, as a semiconductor device, the surface of the semiconductor substrate is sealed by the mold resin. Charged ions (impurity ion) may be liberated from the mold resin. In this case, it is assumed that the RESURF region becomes potentially unstable under the influence of the charged ions, to cause a change in the resistance value of the polysilicon resistance.

The polysilicon resistance of the semiconductor device described in the first embodiment and the like requires a high resistance value of several dozen MΩ in order to reduce the power consumption. Accordingly, the polysilicon resistance is formed such that the amount of the impurities contained in the polysilicon may be inevitably several ppm or less. It is further considered that the inversion layer or accumulation layer which is a phenomenon peculiar to the band structure of a semiconductor may be formed depending on the type and density (the total quantity of electric charge) of the liberated charged ions. In this case, it is assumed that the resistance value of the polysilicon resistance may vary according to this change in the band structure, leading to malfunction.

Figure 16:
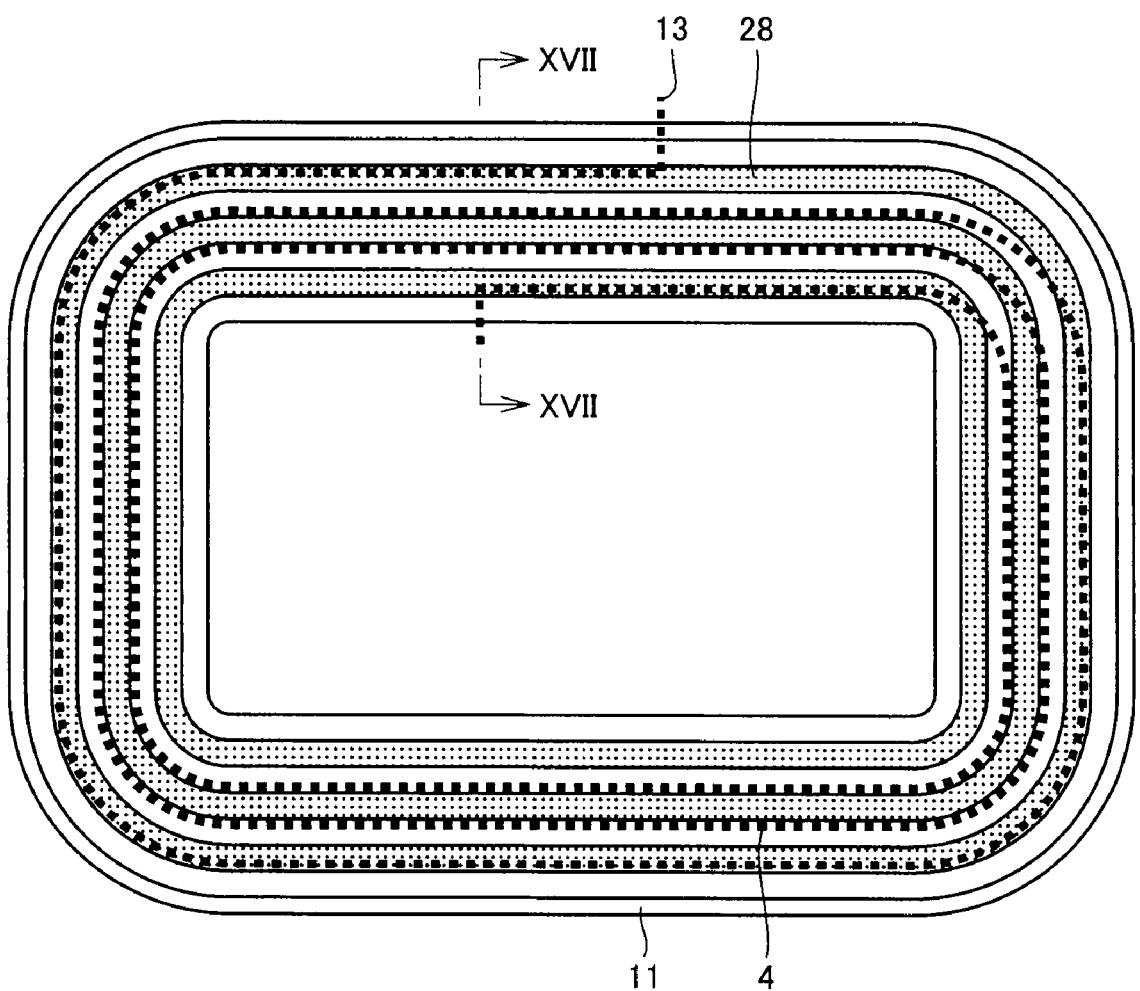
FIG. 16 is a partial plan view of a semiconductor device according to a sixth embodiment of the present invention.
Figure 17:
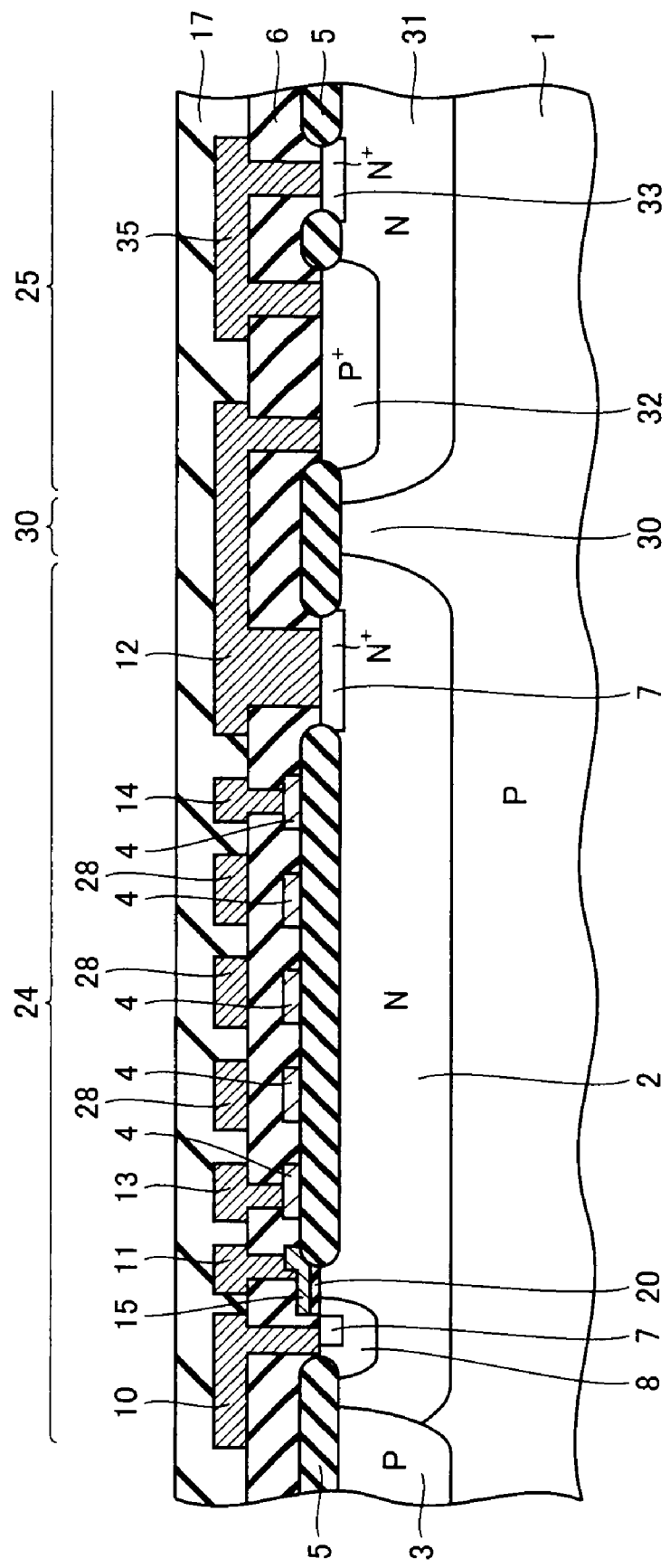
FIG. 17 is a cross sectional view taken along a cross sectional line XVII-XVII shown in FIG. 16 in the present embodiment.

The present semiconductor device serves to avoid the assumed malfunctions described above, in which an electrically floating field plate 28 is formed on the surface of an interlayer oxide film 6 located in RESURF region 24 as shown in FIGS. 16 and 17. Particularly in this semiconductor device, three field plates 28 are formed as a field plate 28 which are arranged perpendicularly in the radial direction of the annular RESURF region. Each field plate 28 is formed continuously in the circumferential direction of annular RESURF region 24. It is to be noted that since configurations other than this are the same as those shown in FIG. 4, the same components are designated by the same reference characters, and description thereof will not be repeated.

In this semiconductor device, in addition to the fact that the area occupied by the circuit previously described can be reduced, the following effects can be achieved. In the present semiconductor device, field plate 28 is disposed to provide capacitive coupling between the ground potential and the high voltage electrode. This prevents the influence of the charged ions liberated from the mold resin (not shown) from being exerted upon RESURF region 24, which leads to stabilization of the resistance value of polysilicon resistance 4. Consequently, the malfunction of the semiconductor device can be prevented.

Although the example in which three field plates 28 are used as a field plate has been described with respect to the above-described semiconductor device, the number of the field plate is not limited thereto.

Seventh Embodiment

Another example of the semiconductor device provided with an electrically floating field plate in the RESURF region will be described below. Polysilicon resistance 4 is formed in the shape of a spiral continuously from the high potential region on the drain electrode 12 side to the low potential region on the source electrode side, and the potential of each portion in polysilicon resistance 4 continuously varies in accordance with Ohm's law.

Accordingly, it is assumed that the potential in the portion of polysilicon resistance 4 overlapping with field plate 28 varies depending on the positions, with the result that the floating potential in field plate 28 may become unstable and the resistance value of polysilicon resistance 4 may be affected. This is because the potential of field plate 28 is determined by the capacitive coupling to polysilicon resistance 4 located directly therebelow, and because the potential of continuously formed annular field plate 28 tends to be uniformly the same since field plate 28 serves as a conductor.

In particular, since field plates 28 located in the outermost periphery and the portion in polysilicon resistance 4 overlapping with this field plates 28 are greater in circumference than other field plates 28 and the portion in polysilicon resistance 4 located in the inner periphery, the potential difference in polysilicon resistance 4 is also increased.

Assuming that the circumferential length is L, the resistance per unit length is $R_L$ and the current flowing through the polysilicon resistance is Ir, a potential difference ΔV of the polysilicon resistance is given by the following expression.

$$\Delta V = L \cdot R_L \cdot Ir$$

Figure 18:
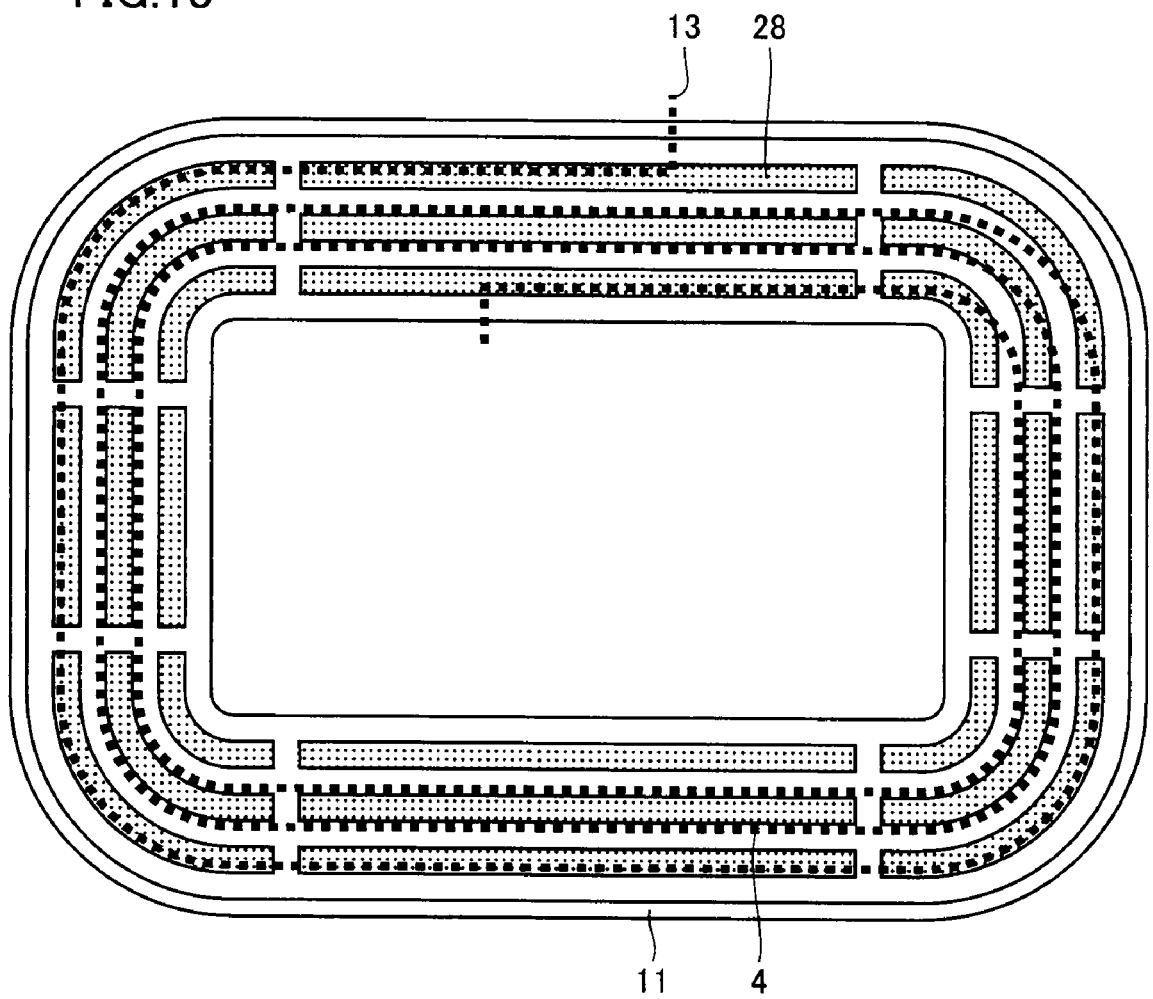
FIG. 18 is a partial plan view of a semiconductor device according to a seventh embodiment of the present invention.

In the present semiconductor device, as shown in FIG. 18, three sets of field plates 28 which each are intermittently formed in the circumferential direction of annular RESURF region 24 are arranged perpendicularly in the radial direction of annular RESURF region 24. In other words, this field plate 28 is configured to have a structure in which slits are provided in proper position in the circumferential direction in field plate 28 shown in FIG. 16 as described above. It is to be noted that since configurations other than this are the same as those shown in FIG. 16, the same components are designated by the same reference characters, and description thereof will not be repeated.

In the semiconductor device as described above, in addition to the fact that the area occupied by the circuit previously described can be reduced, the following effects can be achieved. In the present semiconductor device, field plate 28 is intermittently formed in the circumferential direction of the annular RESURF region. This allows a reliable capacitive coupling to polysilicon resistance 4 having a potential that is continuously variable. Consequently, the malfunction of the semiconductor device can be prevented.

Although, with regard to the field plate described in the sixth and seventh embodiments, the example in which this field plate is applied to the semiconductor device described in the first embodiment has been described, this field plate may be applied to the semiconductor device described in each of the second, third, fourth and fifth embodiments. Also in this case, the malfunction of the semiconductor device can be prevented.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
    a first logic circuit region formed on a main surface of a first conductivity type semiconductor substrate, including a first resistance and a first logic circuit operating with a first driving voltage to control an operation of a predetermined switching element, and applied with a first voltage as a bias voltage;
    an annular region annularly formed on the main surface of said semiconductor substrate to circumferentially surround said first logic circuit region and including a field-effect transistor and a second resistance which are electrically connected to said first resistance;
    an isolation region formed between said first logic circuit region and said annular region, and providing electrical isolation between said first logic circuit region and said annular region; and
    a second logic circuit region formed on the main surface of said semiconductor substrate located outside said annular region, including a second logic circuit electrically connected to said field-effect transistor and said second resistance to operate with a second driving voltage, and applied with a second voltage as a bias voltage lower than said first voltage,
    said first logic circuit for controlling the operation of said switching element based on a predetermined potential difference caused by a drain current flowing through said first resistance when said field-effect transistor is turned on,
    said second logic circuit for detecting a current flowing through said second resistance to thereby determine a gate voltage to be applied to a gate of said field-effect transistor in order to cause a constant current to flow as said drain current, and apply said gate voltage to said gate,
    said annular region electrically isolating a drain of said field-effect transistor applied with said first voltage with respect to said second logic circuit region, and
    said isolation region electrically isolating said first logic circuit region at least by said first driving voltage with respect to the drain of said field-effect transistor which is applied with said first voltage.

2. The semiconductor device according to claim 1, wherein said first logic circuit region includes a second conductivity type first impurity region formed from the main surface of said semiconductor substrate to a predetermined depth,
    said annular region includes a second conductivity type second impurity region formed from the main surface of said semiconductor substrate to a predetermined depth, and
    said isolation region is formed from a portion of a first conductivity type region in said semiconductor substrate interposed between said first impurity region and said second impurity region.

3. The semiconductor device according to claim 2, wherein said first logic circuit region includes
    a first conductivity type third impurity region as said first resistance which is formed from a surface of said first impurity region to a predetermined depth, and
    a second conductivity type fourth impurity region which is formed with a spacing directly below said third impurity region and is higher in impurity concentration than said first impurity region.

4. The semiconductor device according to claim 2, wherein said isolation region includes
a first trench isolation portion formed to provide isolation between the portion of the first conductivity type region in said semiconductor substrate interposed between said first impurity region and said second impurity region, and said first impurity region, and
a second trench isolation portion formed to provide isolation between the portion of said first conductivity type region and said second impurity region.

5. The semiconductor device according to claim 1, comprising a second conductivity type first semiconductor layer having a predetermined thickness and formed on the main surface of said semiconductor substrate, wherein
said first logic circuit region and said annular region are formed in said first semiconductor layer, and
said isolation region includes a first conductivity type first impurity region which is formed to a predetermined depth from a surface of a portion of said first semiconductor layer located between a portion of said first semiconductor layer located in said first logic circuit region and a portion of said first semiconductor layer located in said annular region.

6. The semiconductor device according to claim 1, comprising a second conductivity type first semiconductor layer having a predetermined thickness and formed on the main surface of said semiconductor substrate, wherein
said first logic circuit region and said annular region are formed in said first semiconductor layer, and
said isolation region includes a trench isolation portion which is formed across said first conductivity type region in said semiconductor substrate from a surface of a portion of said first semiconductor layer located between a portion of said first semiconductor layer located in said first logic circuit region and a portion of said first semiconductor layer located in said annular region.

7. The semiconductor device according to claim 1, wherein said annular region includes
a polysilicon resistance formed as said second resistance in a shape of a spiral from an inner side to an outer side of said annular region, and
a plurality of annular field plates each formed along a circumferential direction to surround said polysilicon resistance.

8. The semiconductor device according to claim 7, wherein said annular field plates each are formed intermittently in the circumferential direction.

* * * * *